United States Patent [19]

Hoppal et al.

[11] Patent Number: 5,195,022
[45] Date of Patent: Mar. 16, 1993

[54] REMOVABLE MASS STORAGE MODULE FOR COMPUTER SYSTEMS

[75] Inventors: John P. Hoppal; Arlen L. Roesner, both of Ft. Collins, Colo.

[73] Assignee: Hewlett-Packard Company, Palo Alto, Calif.

[21] Appl. No.: 786,443

[22] Filed: Nov. 1, 1991

[51] Int. Cl.$^5$ .......................... H05K 7/14; H05K 7/12
[52] U.S. Cl. .................................... 361/391; 361/380; 361/427
[58] Field of Search .............................. 439/374, 377; 312/330.1, 341.1; 361/380, 390, 391, 393, 394, 395, 399, 415, 427, 428, 413; 364/708

[56] References Cited

U.S. PATENT DOCUMENTS

| | | | |
|---|---|---|---|
| 4,715,385 | 12/1987 | Cudahy et al. | 364/708 X |
| 4,894,792 | 1/1990 | Mitchell et al. | 364/708 |
| 4,941,841 | 7/1990 | Danden et al. | 364/708 X |
| 4,964,017 | 10/1990 | Jindrick et al. | 361/390 |

FOREIGN PATENT DOCUMENTS 805175 12/1958 United Kingdom ................ 361/390

OTHER PUBLICATIONS

Advertisement, PC Magazine, May 14, 1991, pp. 395 AD for International Technology Corp.

Primary Examiner—Leo P. Picard
Assistant Examiner—Michael W. Phillips
Attorney, Agent, or Firm—Augustus W. Winfield

[57] ABSTRACT

A modular tray assembly for computer mass storage devices such as disk and tape drives. The assembly can be inserted through an opening in the back of a computer without requiring removal of a main computer housing cover. Power is automatically connected when the tray assembly is fully inserted into the computer. Control and data signals are connected via an external cable. Mass storage devices with removable media are accessible through an opening in the front of the computer.

4 Claims, 7 Drawing Sheets

REMOVABLE MASS STORAGE MODULE FOR COMPUTER SYSTEMS

FIELD OF INVENTION

The present invention generally relates to computer data storage systems. More particularly, the invention relates to an apparatus designed to facilitate attachment and removal of mass storage devices (e.g. disk drives) in computer systems.

BACKGROUND OF INVENTION

Modern personal computer systems generally incorporate one or more mass storage devices such as tape drives, flexible disk drives and rigid disk drives. These devices come in a variety of physical sizes. Some devices may be mounted internal to the computer housing while others may be external to the computer. Internal devices need to be removable for replacement and repair. In addition, in some security sensitive environments, mass storage devices need to be removed and locked in a secure place when the computer is not actively in use. Internal devices are generally removable for replacement and repair but removal is typically a job for a technician rather than an end user. Although some computers have drives designed to be easily removed, in most computers removal of storage devices requires removal of a computer housing cover. In addition, removal of the drives usually requires removal of power and signal cables and a variety of mechanical fasteners. Removal of the computer cover potentially exposes the user to hazardous voltages. In addition, removal of the computer cover may expose internal computer components to potential damage from electrostatic discharge. Removal of internal power and signal cables may be intimidating to an untrained user.

Another advantage for easily removable mass storage is software installation and update. Operating systems such as the UNIX operating system are so large and complex that installation and updating usually require a specialist called a systems administrator. Easily removable mass storage permits the systems administrator to perform these tasks at a central or remote site and then ship the new mass storage unit or exchange an updated mass storage unit for a non-updated unit.

Still another general computer industry need is system diagnostics or problem troubleshooting. For diagnostic purposes, a useful technique is to separate hardware problems from software problems by running software from one computer in a second computer and vice versa. This requires transfer of software or the capability of one computer having direct access to the mass storage in another computer.

Still another general need is the transfer of large amounts of software and data from one computer to another. In computers with large operating systems and large software applications, software transfer can be very time consuming. Computers can be linked by networks. However, for diagnostic purposes and for data transfer, a faster and simpler capability would be a capability for a first computer to have direct access to storage devices in a second computer. Data transfer rates by direct connection are usually faster than data transfer rates via network. However, internal mass storage devices generally have signal and power connections internal to the computer so that the devices can be directly used only by the computer in which they are installed.

A need exists in the computer industry for an improved apparatus to facilitate removal of mass storage devices with a minimal amount of effort. In addition, there is a need to easily allow one computer to use mass storage devices in another computer.

SUMMARY OF THE INVENTION

The present invention provides an apparatus for easy removal of mass storage devices from a computer system for repair, replacement, upgrade, data security or transfer of data. The present invention also provides an apparatus for removal of mass storage devices from a computer system without requiring exposure of other system components to the user. In addition, the present invention facilitates the direct use by one computer of mass storage devices in another computer. In the present invention, the mass storage devices are fastened to mounting brackets. Different mounting brackets can be used for various mass storage device types and sizes. The mounting bracket assemblies are attached to a tray assembly. The tray assembly slides on guides into the host computer through the rear of the computer without requiring removal of the main computer cover. A power connector is attached to the tray which mates to a corresponding connector in the host computer when the tray is completely inserted. Signal connections are made by an external cable. The tray design and power connection design facilitate removal and exchange of mass storage devices. Connecting the signal cable externally facilitates direct connection of the drives of a first computer to a second computer.

BRIEF DESCRIPTION OF THE DRAWINGS

The following FIGURES illustrate the preferred embodiment of the present invention.

DETAILED DESCRIPTION OF THE PREFERRED EMBODIMENT OF THE INVENTION

Figure 1:
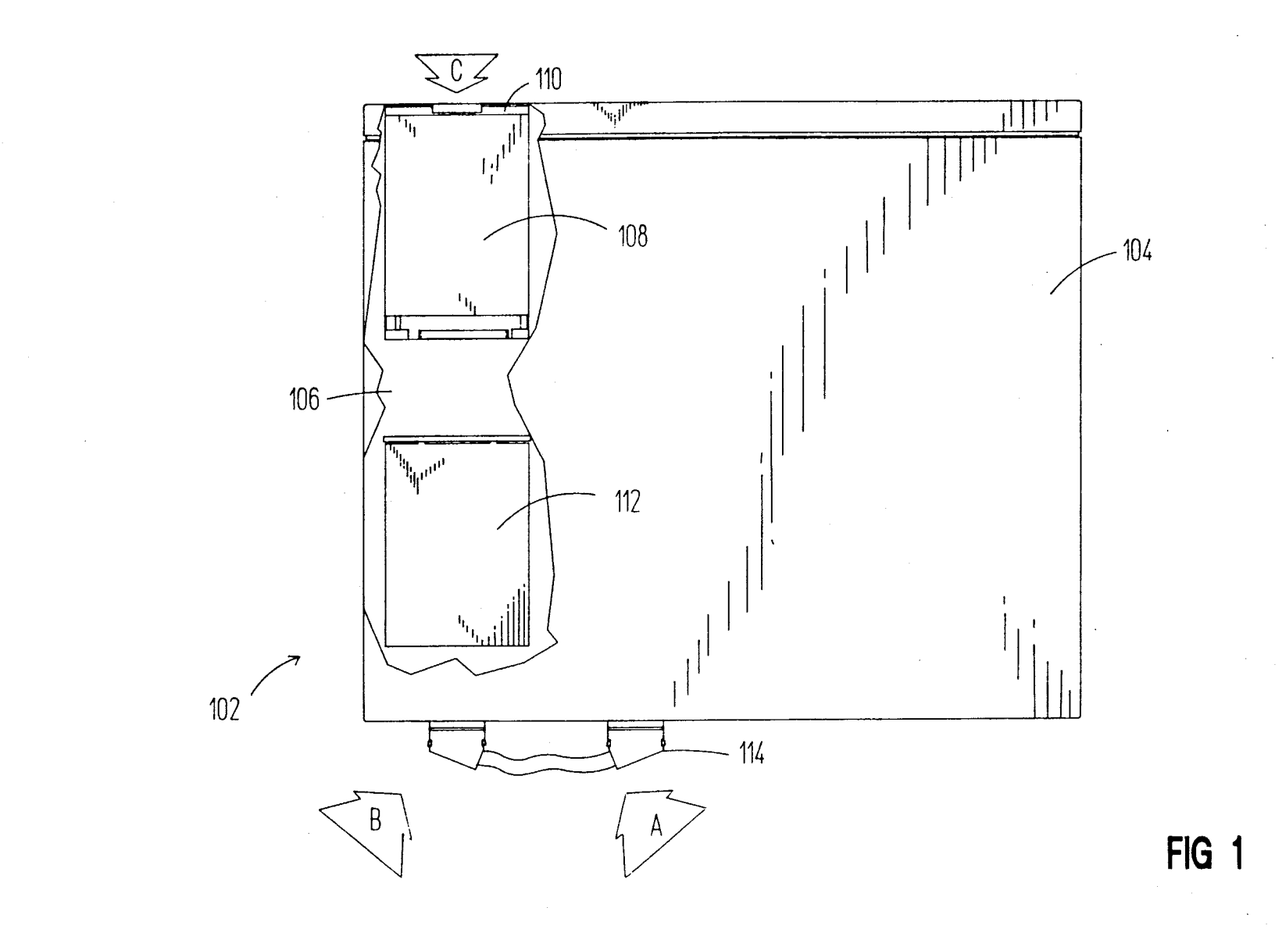
FIG. 1 is a top view of a computer system with a portion of the top cover deleted to illustrate the placement of the mass storage module.

FIG. 1 illustrates a top view of a computer system 102. A portion of the top cover 104 has been deleted to illustrate the placement of a mass storage module 106. As illustrated in FIG. 1, a flexible disk drive 108 is mounted so that a plastic cosmetic bezel 110 protrudes through the front of the computer system 102. The mass storage module 106 also contains a rigid disk drive 112.

An external signal cable 114 connects the mass storage module 106 to an I/0 board (not illustrated) in the computer system 102. In the preferred embodiment of the present invention, the internal I/0 board (not illustrated) and the external signal cable 114 are compatible with the Small Computer Standard Interface (SCSI-2).

Figure 2:
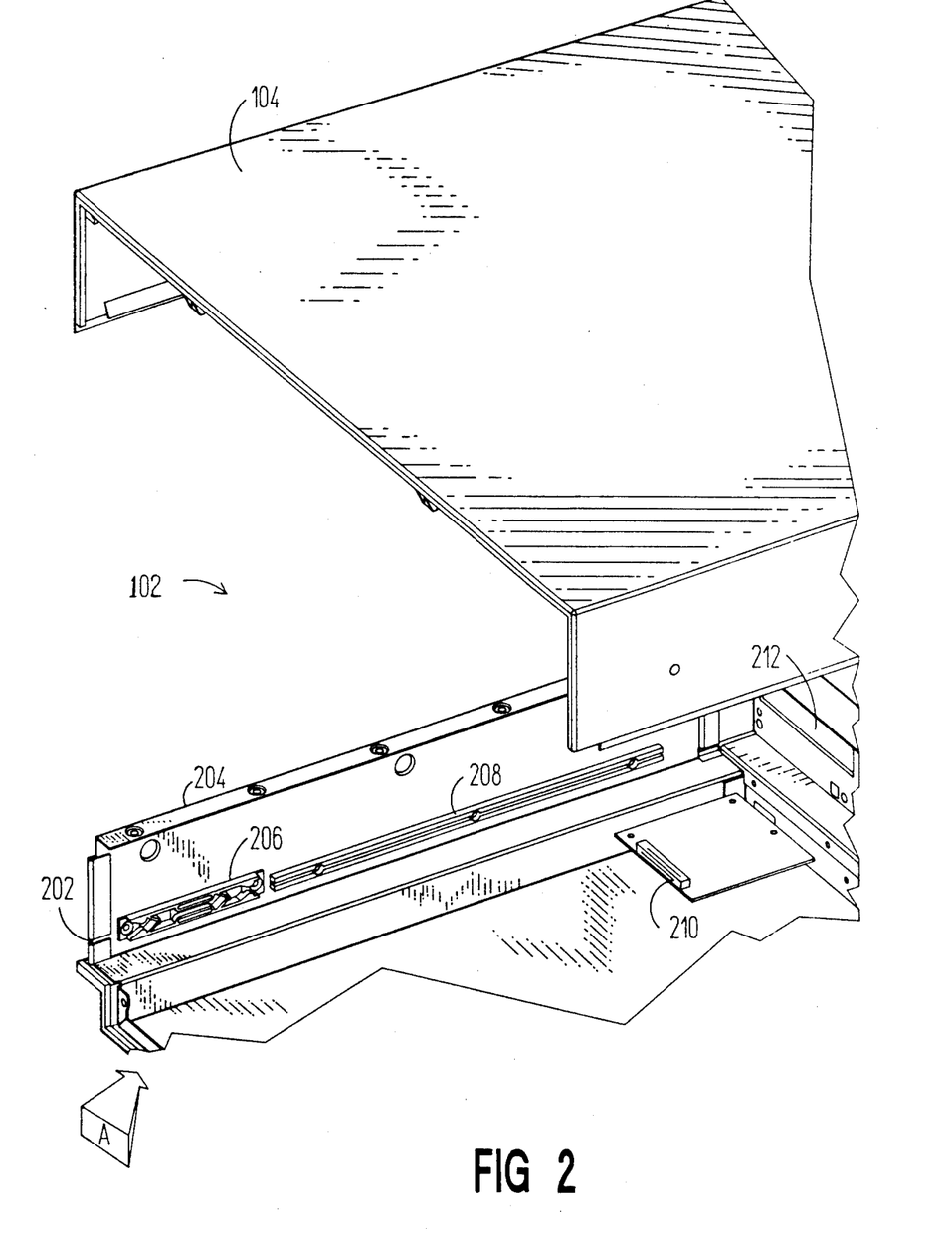
FIG. 2 is a perspective rear view of the computer system of FIG. 1 with the mass storage module removed and portions of the computer deleted to illustrate internal computer chassis details.

FIG. 2 is a perspective view of the rear of the computer system 102 (direction A in FIG. 1). The top cover 104 has been removed for visibility. The mass storage module (not illustrated in FIG. 2) has a metal tray with a first protruding edge (illustrated in FIGURES 3 and 6) which is inserted through a first notch 202 in the computer chassis 204, through a first plastic guide 206, and through a second plastic guide 208. The mass storage module 106 has a power connector (illustrated in FIG. 6) which connects to a chassis power connector 210 when the mass storage module 106 is fully inserted into the computer 102. The flexible disk drive plastic bezel (FIG. 1, 110) protrudes through an opening 212 in the front of the computer chassis 204.

Figure 3:
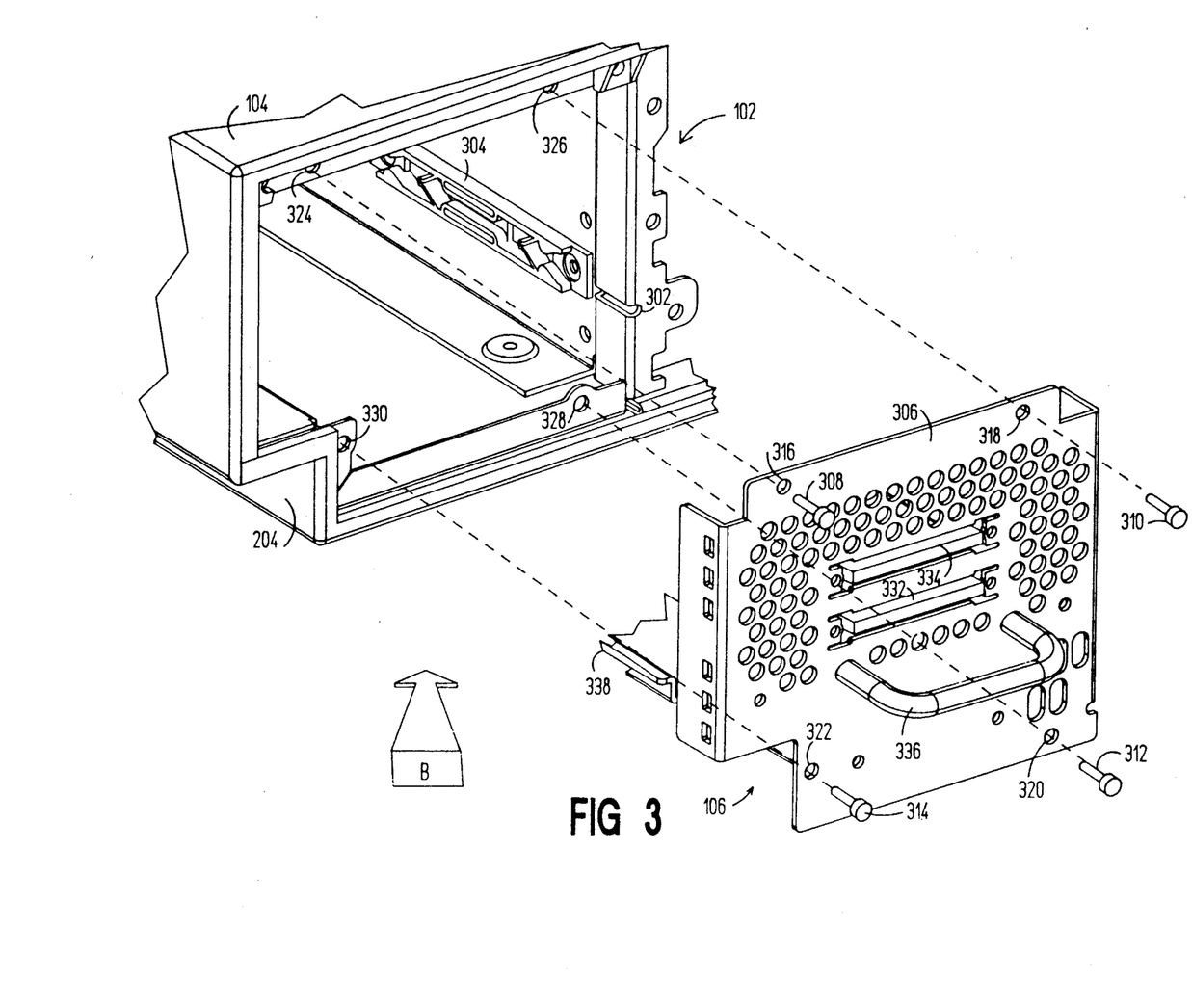
FIG. 3 is a perspective, partially exploded, rear view of the computer system of FIG. 1 with the mass storage module removed and portions of the computer and mass storage tray deleted to illustrate internal computer chassis details and mass storage module cover plate details.

FIG. 3 is a perspective view of the rear of the computer system 102 (direction B in FIG. 1). The top cover 104 is illustrated in the attached position. The mass storage module (only partially illustrated in FIGURE 3) has a metal tray with a second protruding edge (illustrated in FIGS. 4 and 6) which is inserted through a second notch 302 in the computer chassis 204, through a first plastic guide 304, and through a second plastic guide (not illustrated but symmetrical to FIGURE 2, 208).

Continuing with FIG. 3, most of the mass storage module 106 has been deleted to illustrate detail on the metal cover plate 306. The cover plate 306 provides mechanical support, blocks radio frequency interference, and serves as a portion of the back of the host computer. The mass storage module 106 is secured to computer system 102 by four thumb screws (308, 310, 312, 314) passing through four holes (316, 318, 320, 322) in the cover plate 306. The top thumb screws (308, 310) screw into threaded inserts (not illustrated) mounted in holes (324, 326) in a sheet metal lip which is part of the computer top cover 104. The lower two thumb screws (312, 314) screw into threaded inserts (not illustrated) mounted in holes (328, 330) in a sheet metal lip which is part of the computer chassis 204.

Figure 7:
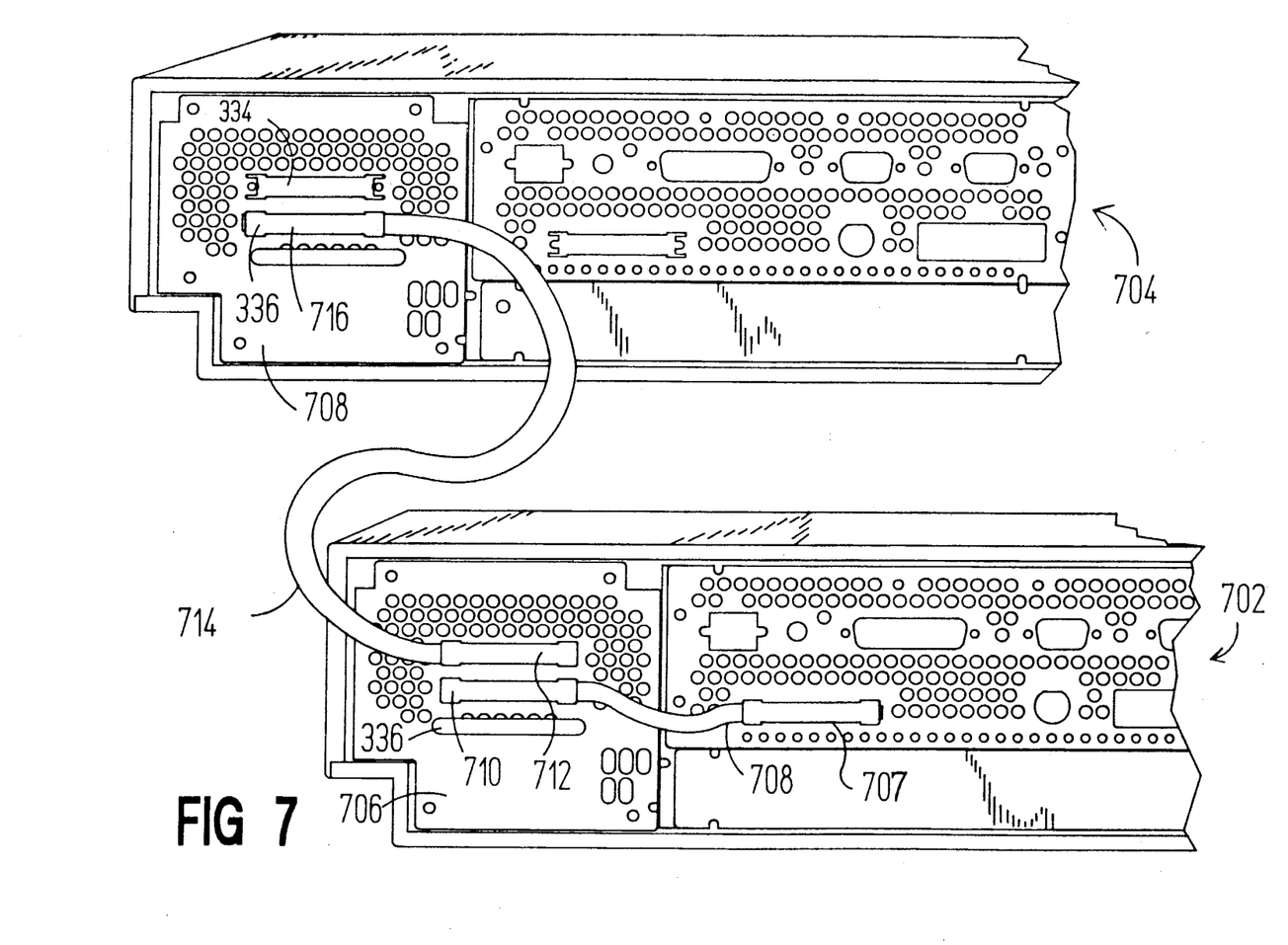
FIG. 7 is a rear view illustrating two computers interconnected so that one computer can use the mass storage devices in a second computer.

Continuing further with FIG. 3, a first external connector 332 is the primary connector for external attachment of a SCSI cable from the computer (FIG. 1, 114 and FIG. 7). A second external connector 334 is a connector for "daisy-chaining" an external SCSI cable to external devices (FIG. 7). A handle 336 is used to facilitate insertion and removal of the mass storage module 106 into and from the computer system 102. The first protruding edge 338 is inserted through a first notch (FIG. 2, 202) and two plastic guides (FIG. 2, 206, 208) in the computer system chassis 204 as illustrated in FIG. 2.

Figure 4:
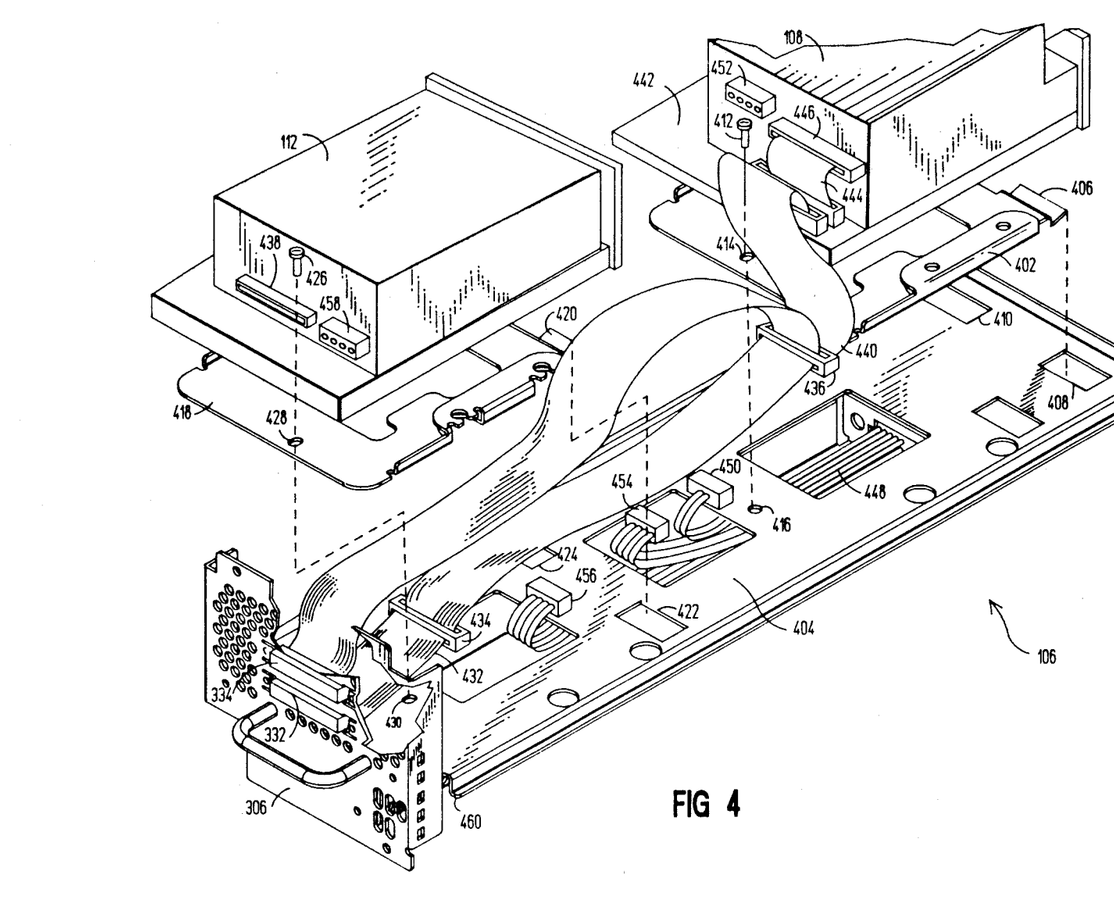
FIG. 4 is a perspective exploded view of the mass storage module.

FIG. 4 illustrates an exploded view of the mass storage module 106. The flexible disk drive 108 is attached to a flexible disk mounting bracket 402. The flexible disk mounting bracket 402 with the flexible disk drive 108 attached is joined to a metal tray 404 first by inserting two tabs (only one tab 406 is visible in FIGURE 4) on the flexible disk mounting bracket 402 through two rectangular holes (408, 410) in the metal tray 404. As the flexible disk mounting bracket 402 is lowered to rest against the metal tray 404, the tabs (only tab 406 is visible) are captured underneath the metal tray 404 (see FIG. 6). The flexible disk mounting bracket 402 is then secure . a single screw 412 passing through a hole 414 in the flexible disk mounting bracket 402 and screwed into a threaded insert (not illustrated) mounted in a hole 416 in the metal tray 404.

Continuing with FIG. 4, the rigid disk drive 112 is attached to a rigid disk mounting bracket 418. Attachment of the rigid disk drive mounting bracket 418 to the metal tray 404 is identical to attachment of the flexible disk mounting bracket 402. Two tabs (only tab 420 is visible) are inserted through two rectangular holes (422, 424) and the rigid disk drive mounting bracket 418 is lowered to the metal tray 404 capturing the two tabs below the metal tray 404. The rigid disk mounting bracket 418 is secured to the metal tray 404 by a single screw 426 passing through a hole 428 in the rigid disk drive mounting bracket 418 and into a threaded insert (not shown) mounted in a hole 430 in the metal tray 404.

Also illustrated in FIG. 4 are the signal and power distribution cable assemblies. A first internal signal cable assembly 432 makes a loop starting with the first external signal connector 332 on the cover plate 306, continuing to a first internal signal connector 434, then to a second internal signal connector 436, and then to the second external connector 334 on the cover plate 306. The first internal signal connector 434 on the first internal signal cable assembly 432 mates with a signal connector 438 on the rigid disk drive 112. The second internal signal connector 436 on the first internal signal cable assembly 432 mates with a second internal signal cable assembly 440. The second internal signal cable assembly 440 attaches to a flexible disk drive adapter board 442. A third internal signal cable assembly 444 connects the flexible disk drive adapter board 442 to a signal connector 446 on the flexible disk drive 108. The first internal signal cable assembly 432 is designed to accommodate a variety of alternative mass storage products. If a second SCSI compatible mass storage device (for example a second rigid disk drive) is used instead of the flexible disk drive 108, the second internal signal cable connector 436 can be connected directly to the second SCSI compatible mass storage device. Non-SCSI-compatible mass storage devices may require an adapter board and additional cable assemblies such as the flexible disk drive adapter board 442 and the second and third internal signal cable assemblies (440, 444).

Figure 6:
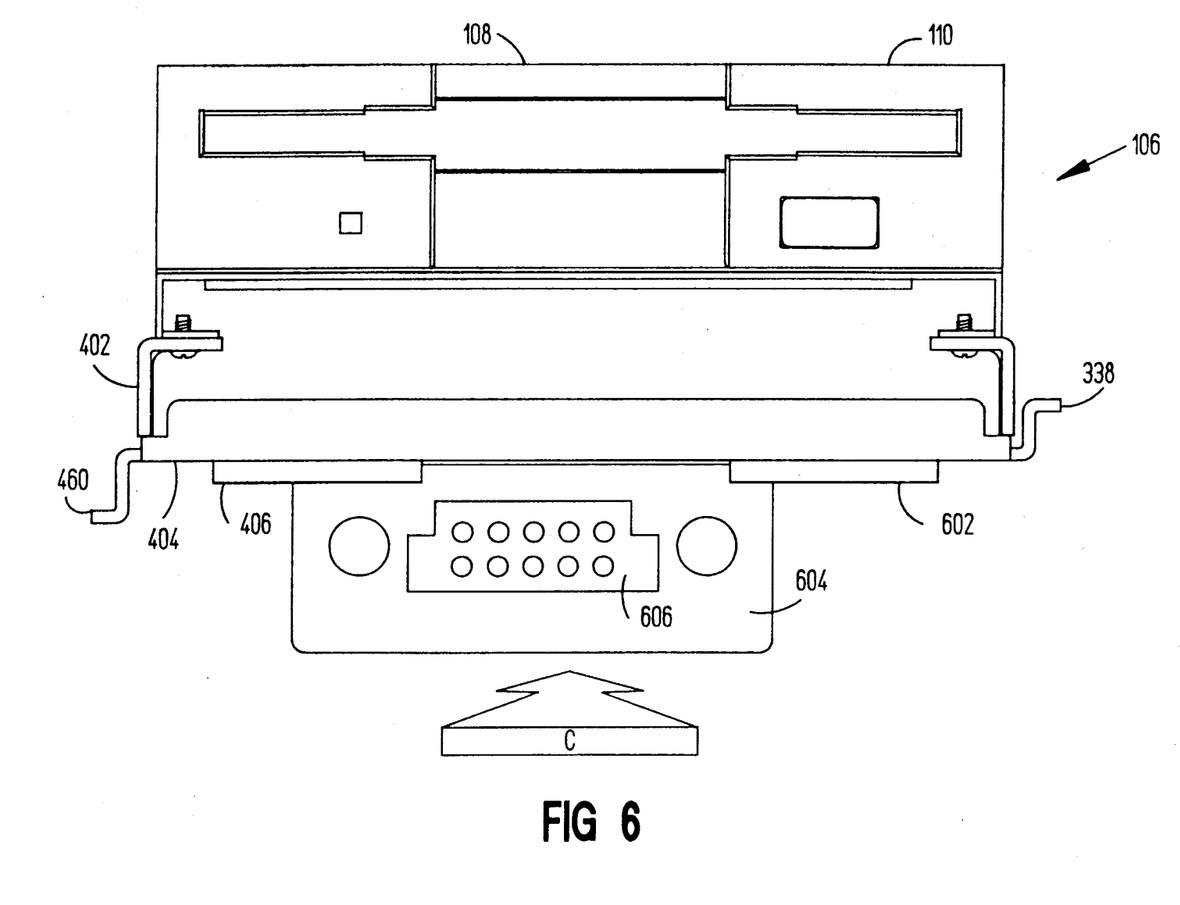
FIG. 6 is a front view of the mass storage module.

Continuing further with FIG. 4, a power cable assembly 448 distributes power from the host computer 102 to the mass storage devices (108, 112). The first power cable connector to the computer is not visible in FIGURE 4 but is illustrated in FIG. 6. A second power cable connector (two wire) 450 mates with a power connector 452 on the flexible disk drive 108. In the configuration illustrated in FIG. 4, a third power cable connector (four wire) 454 is not used. The power cable assembly 448 is designed to accommodate alternative mass storage devices. Connectors 450 and 454 are alternative connectors for mating with mass storage devices. If the front mass storage device is a flexible disk drive (as illustrated in FIG. 4) or some models of tape cartridge drives, the two wire power connector 450 is used. If the front mass storage device is a rigid magnetic disk drive or optical disk drive, the four wire power connector 454 is used. A fourth power cable connector 456 is connected to a power connector 458 on the rigid disk drive 112.

Also illustrated in FIG. 4 is the second protruding edge 460. As discussed with FIG. 3, the second protruding edge 460 is inserted into the computer chassis (FIG. 2, 204) through a second notch (FIG. 3, 302) and through two plastic guides.

Figure 5:
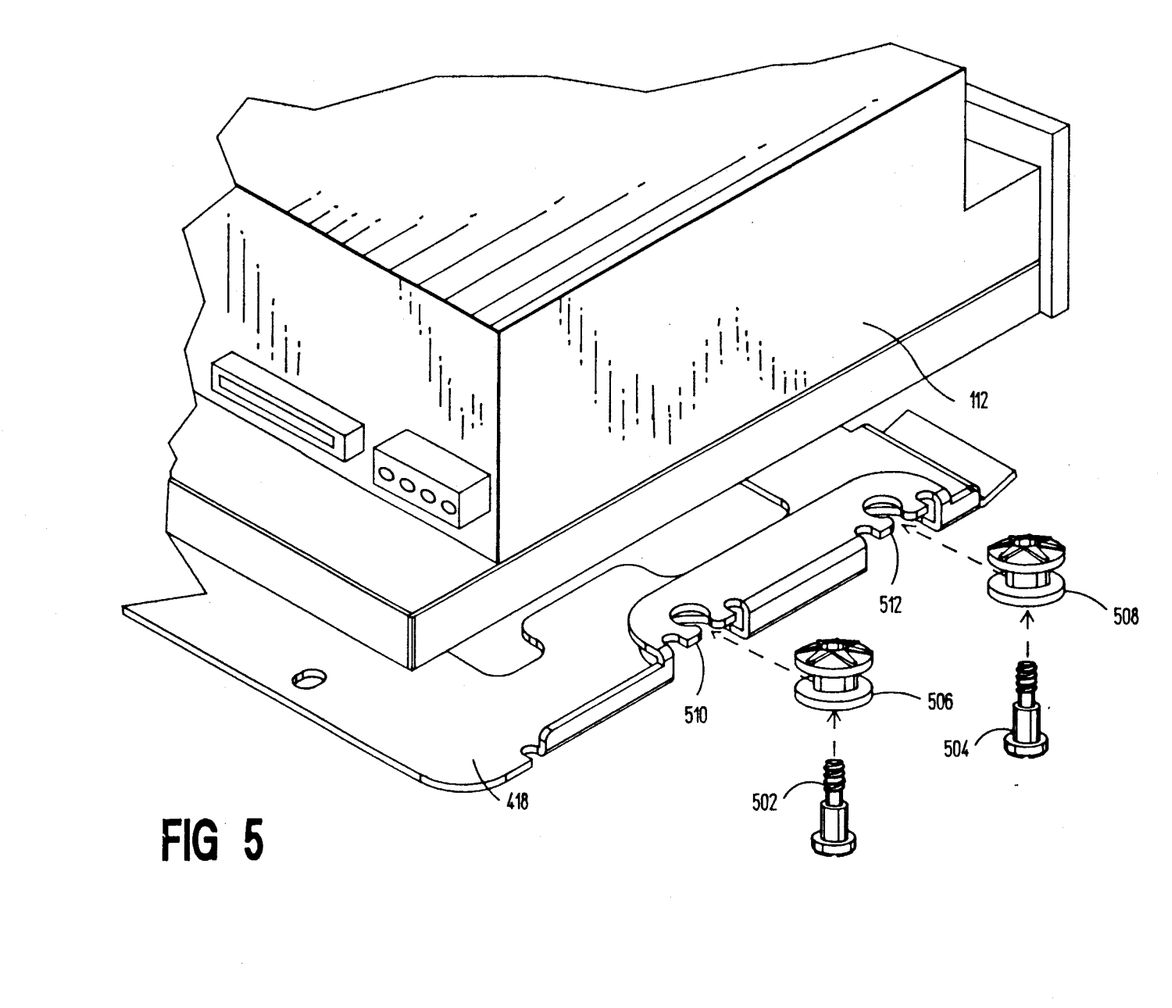
FIG. 5 is a detailed illustration of a rigid disk drive mounting bracket with shock absorption.

FIG. 5 illustrates a mounting bracket with some freedom of movement and shock absorption. Some mass storage devices such as rigid magnetic disk drives are relatively sensitive to mechanical shock. Such devices need to be mounted with some dampened freedom of movement during mechanical shock. The rigid magnetic disk drive 11 is mounted indirectly to the rigid disk drive mounting bracket 418. Mounting screws 502 and 504 pass through flexible grommets 506 and 508 before screwing into the rigid disk drive 112 (holes not illustrated). The flexible grommets (506, 508) are mounted in holes (510, 512) in the rigid disk mounting bracket 418. During mechanical shock, the flexible grommets (506, 508) permit some dampened movement between the rigid disk mounting bracket 418 and the rigid disk drive 112.

FIG. 6 illustrates a front view (direction C in FIG. 1) of the mass storage module 106. Detail has been deleted for clarity. The plastic bezel 110 on the flexible disk drive 108 protrudes through the front of the computer 102 as illustrated in FIG. 1. Tab 406 is attached to the flexible disk mounting bracket 402 and is captured below the metal tray 404 as discussed with FIG. 4. A second tab 602 was not visible in FIG. 4. The metal tray 404 also includes a lower metal trough 604 which contains the power cable assembly (FIG. 4, 448). The first power cable connector 606 connects to a mating connector in the computer 102 (FIG. 2, 210) when the mass storage module 106 is fully inserted into the computer 102. The first protruding edge 338 is inserted through a first slot (FIG. 2, 202) in the computer chassis (FIG. 2, 204). The second protruding edge 460 is inserted through a second slot (FIG. 3, 302) in the computer chassis (FIG. 2, 204).

FIG. 7 illustrates a rear view of a first computer 702 connected to two mass storage modules (706, 708) for transfer of data or troubleshooting. A second computer 704 provides power to the second mass storage module 708. A first SCSI signal connector 707 attached to the first computer 702 provides SCSI signals via a first SCSI cable 708 and second SCSI connector 710 to the first mass storage module 706. An internal signal cable assembly (FIG. 4, 432) routes SCSI signals to mass storage devices within the first mass storage module 706 and back out to the third SCSI connector 712. A second SCSI cable 714 carries SCSI signals to a fourth SCSI connector 716 to the second mass storage module 708. By "daisy chaining" both mass storage modules (706, 708) on one SCSI-2 bus, both mass storage modules (706, 708) are equally available to the first computer 702. The first computer 702 can transfer data from one mass storage module to the other at full SCSI-2 data transfer speeds. Note that SCSI devices have select codes and each of the devices "daisy chained" together must have a unique select code.

The present invention enables mass storage devices to be inserted, changed and removed in a rapid, safe and efficient manner. The entire assembly can be removed and locked in a secure place for data security. Alternatively, the entire assembly can be removed for repair or exchange. The assembly was illustrated with a rigid disk drive and a flexible disk drive. However, mounting brackets can be modified to accommodate a wide variety of mass storage devices such as for example, rigid magnetic disk drives, flexible disk drives, optical disk drives, compact disk (CD) drives, and tape cartridge drives. Likewise, internal signal and power cables can accommodate a variety of devices. The assembly accommodates the needs of devices with removable media, allowing the removable media to be removed through the front of the computer. The assembly can be removed without requiring removal of the computer main cover, thereby eliminating any exposure of the user to dangerous voltages inside the computer system and exposure of internal computer system components to electrostatic discharge. Having the signal cable attached externally facilitates use of mass storage in one computer by a second computer.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. In a computer system having a plurality of internal mass storage device means for storing data, a modular apparatus for mounting said mass storage device means within said computer, the modular apparatus comprising:

tray means for mounting said mass storage device means, said tray means inserted into said computer system through a first opening in a first side of said computer system;

mounting bracket means, attached to said mass storage device means and to said tray means, for attaching said mass storage device means to said tray means;

tray power connector means, mechanically attached to said tray and electrically mating with a corresponding computer power connector in said computer system, for supplying electrical power from said computer system to said modular apparatus;

power distribution cable means, electrically connected to said tray power connector means and to said mass storage device means, for distributing power from said tray power connector means to said mass storage device means;

cover plate means, attached to said tray means and substantially filling said first opening whenever said tray means is fully inserted into said computer system, for providing mechanical support for said tray means;

first external signal connector means, mechanically attached to said power plate means, for electrically connecting to mass storage control and data signals external to said modular apparatus;

second external signal connector means, mechanically attached to said cover plate means, for electrically connecting to mass storage control and data signals external to said modular apparatus;

internal signal distribution cable means, electrically connected to said first external signal connector, to said mass storage device means and to said second external signal connector means, for supplying control and data signals between said mass storage device means and said first and second external signal connector means;

wherein said computer system has a second opening in a second surface and wherein said plurality of mass storage device means comprises:

first disk drive means with non-removable media; and second disk drive means with removable media, a face of said second disk drive means substantially filling said second opening and said removable media accessible through said second opening.

2. An apparatus as in claim 1 wherein said mounting bracket means for said first disk drive means further comprises:

shock absorbing means, having a plurality of flexible grommets mounted in holes in said mounting bracket means, each said grommet having a mechanical fastener passing through said grommet hole and attached to said first disk drive means, for allowing movement between said first disk drive means and said bracket means.

3. In a computer system having a plurality of internal mass storage device means for storing data, a modular apparatus for mounting said mass storage device means within said computer, the modular apparatus comprising:

tray means for mounting said mass storage device means, said tray means inserted into said computer system through a first opening in a first side of said computer system;

mounting bracket means, attached to said mass storage device means and to said tray means, for attaching said mass storage device means to said tray means;

tray power connector means, mechanically attached to said tray and electrically mating with a corresponding computer power connector in said computer system, for supplying electrical power from said computer-system to said modular apparatus;

power distribution cable means, electrically connected to said tray power connector means and to said mass storage device means, for distributing power from said tray power connector means to said mass storage device means;

cover plate means, attached to said tray means and substantially filling said first opening whenever said tray means is fully inserted into said computer system, for providing mechanical support for said tray means;

first external signal connector means, mechanically attached to said cover plate means, for electrically connecting to mass storage control and data signals external to said modular apparatus;

second external signal connector means, mechanically attached to said cover plate means, for electrically connecting to mass storage control and data signals external to said modular apparatus; and internal signal distribution cable means, electrically connected to said first external signal connector, to said mass storage device means and to said second external signal connector means, for supplying control and data signals between said mass storage device means and said first and second external signal connector means;

wherein said computer system has a second opening in a second surface and wherein said plurality of mass storage device means comprises:

first disk drive means with non-removable means; and tape drive means with removable media, a face of said tape drive means substantially filling said second opening and said removable media accessible through said second opening.

4. An apparatus as in claim 3 wherein said mounting bracket means for said first disk drive means further comprises:

shock absorbing means, having a plurality of flexible grommets mounted in holes in said mounting bracket means, each said grommet having a mechanical fastener passing through said grommet hole and attached to said first disk drive means, for allowing movement between said first disk drive means and said bracket means.

* * * * *

UNITED STATES PATENT AND TRADEMARK OFFICE
CERTIFICATE OF CORRECTION

PATENT NO.    :  5,195,022

DATED         :  March 16, 1993

INVENTOR(S)   :  John P. Hoppal and Arlen L. Roesner

It is certified that error appears in the above-identified patent and that said Letters Patent is hereby corrected as shown below:

Column 6, Line 58, "power" should read -- cover --;

Column 8, Line 27, "first disk drive means with non-removable means; and" should read -- first disk drive means with non-removable media; and --.

Signed and Sealed this

Fourth Day of January, 1994

Attest:

BRUCE LEHMAN

*Attesting Officer*    *Commissioner of Patents and Trademarks*